(12) United States Patent
Parkhe et al.

(10) Patent No.: US 9,685,356 B2
(45) Date of Patent: Jun. 20, 2017

(54) SUBSTRATE SUPPORT ASSEMBLY HAVING METAL BONDED PROTECTIVE LAYER

(71) Applicant: Applied Materials, Inc., Santa Clara, CA (US)

(72) Inventors: Vijay D. Parkhe, San Jose, CA (US); Kadthala Ramaya Narendrnath, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 729 days.

(21) Appl. No.: 13/842,044

(22) Filed: Mar. 15, 2013

(65) Prior Publication Data

US 2014/0159325 A1 Jun. 12, 2014

Related U.S. Application Data

(60) Provisional application No. 61/735,895, filed on Dec. 11, 2012.

(51) Int. Cl.
| | | |
|---|---|---|
| *H05B 3/68* | (2006.01) | |
| *H01L 21/67* | (2006.01) | |
| *H01L 21/683* | (2006.01) | |
| *H01J 37/32* | (2006.01) | |

(52) U.S. Cl.
CPC .. *H01L 21/67109* (2013.01); *H01J 37/32715* (2013.01); *H01L 21/6831* (2013.01); *Y10T 156/10* (2015.01); *Y10T 279/23* (2015.01)

(58) Field of Classification Search
CPC ......... H01J 37/32715; H01L 21/67109; H01L 21/6831; Y10T 156/10; Y10T 279/23

USPC ................... 219/443.1, 444.1; 118/724–725; 361/234
See application file for complete search history.

(56) References Cited

U.S. PATENT DOCUMENTS

| | | | |
|---|---|---|---|
| 4,439,248 A | 3/1984 | Herchenroeder et al. | |
| 4,725,566 A | 2/1988 | Pham Ngu et al. | |
| 5,034,688 A * | 7/1991 | Moulene ............ | G01R 31/2874 165/80.4 |
| 5,108,025 A * | 4/1992 | Kang .................... | C04B 37/026 228/124.7 |
| 5,113,472 A | 5/1992 | Gualtieri et al. | |
| 5,381,944 A | 1/1995 | Makowiecki et al. | |

(Continued)

FOREIGN PATENT DOCUMENTS

| | | |
|---|---|---|
| DE | 200301654 | 6/2003 |
| JP | 2000306986 A | 11/2000 |

(Continued)

OTHER PUBLICATIONS

Taffner et al., "Preparation and Microstructural Analysis of High-Performance Ceramics," ASM Handbook vol. 9: Metallography and Microstructures, 2004, 11 pages, ASM International, Materials Park, Ohio, USA.

(Continued)

*Primary Examiner* — Sang Y Paik
(74) *Attorney, Agent, or Firm* — Lowenstein Sandler LLP

(57) ABSTRACT

A substrate support assembly comprises a ceramic body and a thermally conductive base bonded to a lower surface of the ceramic body. The substrate support assembly further comprises a protective layer metal bonded to an upper surface of the ceramic body, wherein the protective layer is a bulk sintered ceramic article.

13 Claims, 11 Drawing Sheets

(56) References Cited

U.S. PATENT DOCUMENTS

| | | | |
|---|---|---|---|
| 5,548,470 A | 8/1996 | Husain et al. | |
| 5,631,803 A | 5/1997 | Cameron et al. | |
| 5,680,013 A | 10/1997 | Dornfest et al. | |
| 5,800,871 A | 9/1998 | Collins et al. | |
| 5,886,863 A * | 3/1999 | Nagasaki | H01L 21/6831 279/128 |
| 5,903,428 A | 5/1999 | Grimard et al. | |
| 5,916,689 A | 6/1999 | Collins et al. | |
| 6,063,203 A | 5/2000 | Satoh | |
| 6,194,083 B1 | 2/2001 | Yasuda et al. | |
| 6,245,202 B1 | 6/2001 | Edamura et al. | |
| 6,361,645 B1 | 3/2002 | Schoepp et al. | |
| 6,444,957 B1 * | 9/2002 | Kitagawa | H01L 21/67103 118/725 |
| 6,500,265 B1 | 12/2002 | Shang et al. | |
| 6,506,254 B1 | 1/2003 | Bosch et al. | |
| 6,508,884 B2 * | 1/2003 | Kuibira | C04B 37/005 118/724 |
| 6,534,194 B2 | 3/2003 | Weihs et al. | |
| 6,581,275 B2 | 6/2003 | Narendrnath et al. | |
| 6,616,031 B2 | 9/2003 | Wong et al. | |
| 6,641,697 B2 | 11/2003 | Han et al. | |
| 6,780,787 B2 | 8/2004 | O'Donnell | |
| 6,805,952 B2 | 10/2004 | Chang et al. | |
| 6,921,881 B2 * | 7/2005 | Ito | B32B 18/00 219/145.22 |
| 6,933,254 B2 | 8/2005 | Morita et al. | |
| 6,942,929 B2 | 9/2005 | Han et al. | |
| 7,441,688 B2 | 10/2008 | Van Heerden et al. | |
| 7,615,133 B2 | 11/2009 | Tateno et al. | |
| 7,649,729 B2 | 1/2010 | Buchberger, Jr. et al. | |
| 7,690,308 B2 | 4/2010 | Nielson et al. | |
| 7,696,117 B2 | 4/2010 | Sun et al. | |
| 7,718,007 B2 | 5/2010 | Oohashi et al. | |
| 7,810,704 B2 | 10/2010 | Duckham et al. | |
| 7,824,498 B2 | 11/2010 | Parkhe et al. | |
| 7,964,517 B2 | 6/2011 | Jaiswal | |
| 8,034,734 B2 | 10/2011 | Sun et al. | |
| 8,075,729 B2 | 12/2011 | Holland et al. | |
| 8,206,829 B2 | 6/2012 | Sun et al. | |
| 8,404,572 B2 | 3/2013 | Chang et al. | |
| 8,829,397 B2 * | 9/2014 | Kano | H01L 21/67103 118/725 |
| 8,852,348 B2 | 10/2014 | Parkhe et al. | |
| 8,941,969 B2 | 1/2015 | Thach et al. | |
| 2002/0129904 A1 | 9/2002 | Itabashi et al. | |
| 2002/0177001 A1 | 11/2002 | Harada et al. | |
| 2003/0007308 A1 | 1/2003 | Harada et al. | |
| 2003/0047802 A1 | 3/2003 | Hiramatsu et al. | |
| 2003/0161088 A1 | 8/2003 | Migita | |
| 2003/0170415 A1 | 9/2003 | Hiramatsu et al. | |
| 2004/0002221 A1 | 1/2004 | O'Donnell et al. | |
| 2004/0055709 A1 | 3/2004 | Boyd, Jr. et al. | |
| 2004/0065259 A1 * | 4/2004 | Inazumachi | H01J 37/32724 118/724 |
| 2004/0117977 A1 | 6/2004 | Hiramatsu et al. | |
| 2004/0187787 A1 | 9/2004 | Dawson et al. | |
| 2004/0240142 A1 | 12/2004 | Fujii et al. | |
| 2005/0016684 A1 | 1/2005 | Sun et al. | |
| 2005/0037193 A1 | 2/2005 | Sun et al. | |
| 2005/0045106 A1 | 3/2005 | Boyd et al. | |
| 2005/0056218 A1 | 3/2005 | Sun et al. | |
| 2005/0215073 A1 | 9/2005 | Nakamura et al. | |
| 2005/0266682 A1 | 12/2005 | Chen et al. | |
| 2006/0002053 A1 | 1/2006 | Brown et al. | |
| 2006/0164785 A1 | 7/2006 | Pellegrin | |
| 2007/0047170 A1 | 3/2007 | Sun et al. | |
| 2007/0212567 A1 | 9/2007 | Esaki et al. | |
| 2008/0016684 A1 | 1/2008 | Olechnowicz et al. | |
| 2008/0029032 A1 | 2/2008 | Sun et al. | |
| 2008/0174930 A1 | 7/2008 | Hattori et al. | |
| 2008/0264564 A1 | 10/2008 | Sun et al. | |
| 2008/0264565 A1 | 10/2008 | Sun et al. | |
| 2008/0266746 A1 * | 10/2008 | Handa | H01L 21/6831 361/234 |
| 2008/0268645 A1 | 10/2008 | Kao et al. | |
| 2009/0034147 A1 | 2/2009 | Narendrnath et al. | |
| 2009/0034148 A1 | 2/2009 | Lubomirsky et al. | |
| 2009/0034149 A1 | 2/2009 | Lubomirsky et al. | |
| 2009/0036292 A1 | 2/2009 | Sun et al. | |
| 2009/0159588 A1 * | 6/2009 | Morioka | H01L 21/67103 219/444.1 |
| 2009/0214825 A1 | 8/2009 | Sun et al. | |
| 2009/0284894 A1 | 11/2009 | Cooke | |
| 2010/0053841 A1 | 3/2010 | Rusinko, Jr. et al. | |
| 2010/0116788 A1 | 5/2010 | Singh et al. | |
| 2010/0119843 A1 | 5/2010 | Sun et al. | |
| 2010/0177454 A1 | 7/2010 | Elliot et al. | |
| 2010/0314356 A1 | 12/2010 | Nagayama et al. | |
| 2011/0049729 A1 | 3/2011 | Naundorf et al. | |
| 2011/0149462 A1 | 6/2011 | Kugimoto et al. | |
| 2011/0174441 A1 | 7/2011 | Yamashita et al. | |
| 2012/0034469 A1 | 2/2012 | Sun et al. | |
| 2012/0076574 A1 | 3/2012 | Parkhe | |
| 2012/0104703 A1 | 5/2012 | Sun et al. | |
| 2012/0141661 A1 | 6/2012 | Cho et al. | |
| 2012/0299253 A1 | 11/2012 | Kosakai et al. | |
| 2012/0307412 A1 | 12/2012 | Boyd, Jr. et al. | |
| 2013/0019797 A1 | 1/2013 | Tanaka et al. | |
| 2013/0026720 A1 | 1/2013 | Hori et al. | |
| 2013/0224675 A1 | 8/2013 | Park | |
| 2014/0154465 A1 | 6/2014 | Sun et al. | |
| 2014/0159325 A1 | 6/2014 | Parkhe et al. | |
| 2014/0203526 A1 | 7/2014 | Banda et al. | |

FOREIGN PATENT DOCUMENTS

| | | |
|---|---|---|
| JP | 2001308075 A | 11/2001 |
| JP | 2006216224 A | 8/2006 |
| JP | 2008016709 A | 1/2008 |
| WO | WO0124581 | 4/2001 |
| WO | WO03100843 | 12/2003 |
| WO | WO2005027203 A2 | 3/2005 |

OTHER PUBLICATIONS

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis," Image Anal Stereo 2011;30:53-62, Published Jan. 27, 2011.

International Search Report & Written Opinion of the International Searching Authority dated Mar. 20, 2014, in International Application No. PCT/US2013/074064.

Haas et al., "Gas jet assisted vapor deposition of yttria stabilized zirconia," Department of Materials Science and Engineering, School of Engineering and Applied Science, published Feb. 27, 2009 University of Virginia, Charlottesville, Virginia 22903.

* cited by examiner

SUBSTRATE SUPPORT ASSEMBLY HAVING METAL BONDED PROTECTIVE LAYER

RELATED APPLICATIONS

This patent application claims the benefit under 35 U.S.C. §119(e) of U.S. Provisional Application No. 61/735,895, filed Dec. 11, 2012.

TECHNICAL FIELD

Some embodiments of the present invention relate, in general, to a substrate support assembly such as an electrostatic chuck that has a plasma resistant protective layer. Other embodiments relate to reactive multi-layer foils and the manufacture of reactive multi-layer foils.

BACKGROUND

In the semiconductor industry, devices are fabricated by a number of manufacturing processes producing structures of an ever-decreasing size. Some manufacturing processes such as plasma etch and plasma clean processes expose a substrate support (e.g., an edge of the substrate support during wafer processing and the full substrate support during chamber cleaning) to a high-speed stream of plasma to etch or clean the substrate. The plasma may be highly corrosive, and may corrode processing chambers and other surfaces that are exposed to the plasma.

Additionally, traditional electrostatic chucks include a ceramic puck silicone bonded to a metal cooling plate. The Ceramic puck in such traditional electrostatic chucks is manufactured by a multi-step manufacturing process that can be costly to form an embedded electrode and heating elements.

Reactive multilayer foils (referred to herein as reactive foils) are used to form a metal bond between substrates. Traditional reactive foil is manufactured in flat featureless sheets. Traditional reactive foil is typically not appropriate for bonding substrates having non-flat surfaces. Additionally, if the traditional reactive foil is used to bond substrates having surface features, the reactive foil is machined (e.g., by laser drilling, chemical etching, etc.) to form corresponding features in the reactive foil. Such machining can induce a heat load on the reactive foil and cause the reactive foil to ignite. Moreover, traditional reactive foil has a preset size such as 9 inch squares. When the traditional reactive foil is used to bond substrates that are larger than the reactive foil, then multiple sheets of reactive foil are used to perform the bonding. This commonly introduces leakage paths such as cracks, grooves, lines, etc. between the reactive foil sheets, and causes the resultant metal bond to not be vacuum sealed.

SUMMARY

In one embodiment, an electrostatic chuck includes a ceramic body and a thermally conductive base bonded to a lower surface of the ceramic body. The ceramic body may be bonded to the thermally conductive base by a metal bond or by a silicone bond. The electrostatic chuck is fabricated with a protective layer bonded to an upper surface of the ceramic body by a metal bond, the protective layer comprising a bulk sintered ceramic article.

In another embodiment, reactive foil is manufactured. A template having one or more surface features is provided. Alternating nanoscale layers of aluminum and nickel are deposited onto the template to form a reactive foil sheet. The reactive foil sheet is removed from the template. The resultant reactive foil sheet has one or more foil features corresponding to one or more surface features.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide a substrate support assembly (e.g., an electrostatic chuck) having a protective layer formed over a ceramic body of the substrate support assembly. The protective layer may provide plasma corrosion resistance for protection of the ceramic body. The protective layer may be a bulk sintered ceramic article (e.g., a ceramic wafer) that is metal bonded to the ceramic body using a nano-bonding technique. Various bonding materials such as In, Sn, Ag, Au, Cu and their alloys could be used along with a reactive foil.

In one embodiment, the ceramic body is a bulk sintered ceramic body (e.g., another ceramic wafer). When the ceramic body does not include a chucking electrode, the metal bond may function as a chucking electrode for the electrostatic chuck. The ceramic body may additionally be metal bonded to a thermally conductive base by another metal bond. The thermally conductive base may include heating elements as well as channels that can be used to regulate temperature by flowing liquid for heating and/or cooling. The metal bond between the thermally conductive base and the ceramic body provides a good thermal contact, and enables the thermally conductive base to heat and cool the ceramic body, the protective layer and any substrate held by the electrostatic chuck during processing. Embodiments provide an electrostatic chuck that can be as much as 4× cheaper to manufacture than conventional electrostatic chucks. Moreover, embodiments provide an electrostatic chuck that can adjust temperature rapidly and that is plasma resistant. The electrostatic chuck and a substrate being supported may be heated or cooled quickly, with some embodiments enabling temperature changes of 2° C./s or faster. This enables the electrostatic chuck to be used in multi-step processes in which, for example, a wafer may be processed at 20-30° C. and then rapidly ramped up to 80-90° C. for further processing. The embodiments described herein may be used for both Coulombic electrostatic chucking applications and Johnson Raybek chucking applications.

In another embodiment, reactive foil is manufactured that has preformed surface features. The reactive foil may be manufactured by depositing alternating nanoscale layers of two reactive materials such as aluminum and nickel onto a template that has surface features. The surface features of the template may correspond to surface features of one or more substrates that the reactive foil will be used to bond. For example, if the one or more substrates have holes in them, then the template may have steps corresponding to the holes. These steps may cause reactive foil formed on the template to have preformed holes that correspond to the holes in the substrate.

Figure 1:
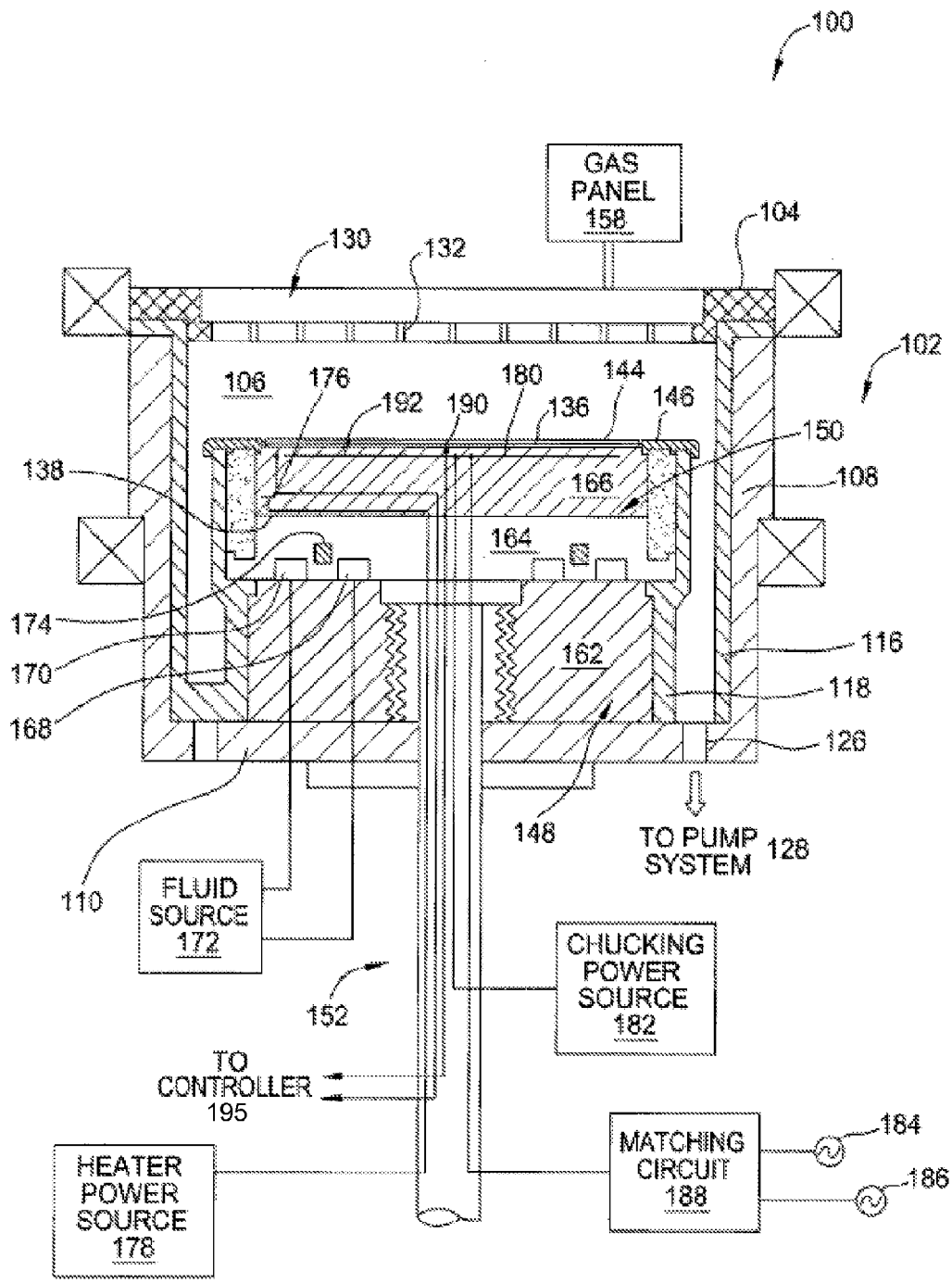
FIG. 1 depicts a sectional view of one embodiment of a processing chamber.

FIG. 1 is a sectional view of one embodiment of a semiconductor processing chamber 100 having a substrate support assembly 148 disposed therein. The substrate support assembly 148 has a protective layer 136 of a bulk ceramic that has been metal bonded to a ceramic body of the substrate support assembly 148. The metal bond may include a combination of metals, such as a combination of indium, tin, aluminum, nickel and one or more additional metals (e.g., such as gold or silver). The metal bonding process is described in greater detail below.

The protective layer may be a bulk ceramic (e.g., a ceramic wafer) such as $Y_2O_3$ (yttria or yttrium oxide), $Y_4Al_2O_9$ (YAM), $Al_2O_3$ (alumina) $Y_3Al_5O_{12}$ (YAG), YAlO3 (YAP), Quartz, SiC (silicon carbide), $Si_3N_4$ (silicon nitride), Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

The protective layer may be a sintered ceramic article that was produced from a ceramic powder or a mixture of ceramic powders. For example, the ceramic composite may be produced from a mixture of a $Y_2O_3$ powder, a $ZrO_2$ powder and an $Al_2O_3$ powder. The ceramic composite may include $Y_2O_3$ in a range of 50-75 mol %, $ZrO_2$ in a range of 10-30 mol % and $Al_2O_3$ in a range of 10-30 mol %. In one embodiment, the HPM ceramic composite contains approximately 77% $Y_2O_3$, 15% $ZrO_2$ and 8% $Al_2O_3$. In another embodiment, the ceramic composite contains approximately 63% $Y_2O_3$, 23% $ZrO_2$ and 14% $Al_2O_3$. In still another embodiment, the HPM ceramic composite contains approximately 55% $Y_2O_3$, 20% $ZrO_2$ and 25% $Al_2O_3$. Relative percentages may be in molar ratios. For example, the HPM ceramic composite may contain 77 mol % $Y_2O_3$, 15 mol % $ZrO_2$ and 8 mol % $Al_2O_3$. Other distributions of these ceramic powders may also be used for the ceramic composite.

The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

The substrate support assembly 148 is disposed in the interior volume 106 of the processing chamber 100 below the gas distribution assembly 130. The substrate support assembly 148 holds the substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. In one embodiment, the electrostatic chuck 150 further includes a thermally conductive base 164 bonded to an electrostatic puck 166 by a metal or silicone bond 138. Alternatively, a simple ceramic body may be used instead of the electrostatic puck 166, as will be described in greater detail with reference to FIG. 3. An upper surface of the electrostatic puck 166 is covered by the protective layer 136 that is metal bonded to the electrostatic puck 166. In one embodiment, the protective layer 136 is disposed on the upper surface of the electrostatic puck 166. In another embodiment, the protective layer 136 is disposed on the entire surface of the electrostatic chuck 150 including the outer and side periphery of the thermally conductive base 164 and the electrostatic puck 166. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) being processed. The temperature of the electrostatic puck 166 and the thermally conductive base 164 may be monitored using a plurality of temperature sensors 190, 192, which may be monitored using a controller 195.

The electrostatic puck 166 and/or protective layer may further include multiple gas passages such as grooves, mesas and other surface features, that may be formed in an upper surface of the puck 166 and/or the protective layer. The gas passages may be fluidly coupled to a source of a heat transfer (or backside) gas, such as He via holes drilled in the puck 166. In operation, the backside gas may be provided at controlled pressure into the gas passages to enhance the heat transfer between the electrostatic puck 166 and the substrate 144.

In one embodiment, the electrostatic puck 166 includes at least one clamping electrode 180 controlled by a chucking power source 182. In alternative embodiments, the metal bond may function as the clamping electrode. Alternatively, the protective layer may include an embedded clamping electrode (also referred to as a chucking electrode). The electrode 180 (or other electrode disposed in the puck 166 or protective layer) may further be coupled to one or more RF power sources 184, 186 through a matching circuit 188 for maintaining a plasma formed from process and/or other gases within the processing chamber 100. The sources 184, 186 are generally capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the chucking electrode.

Figure 2:
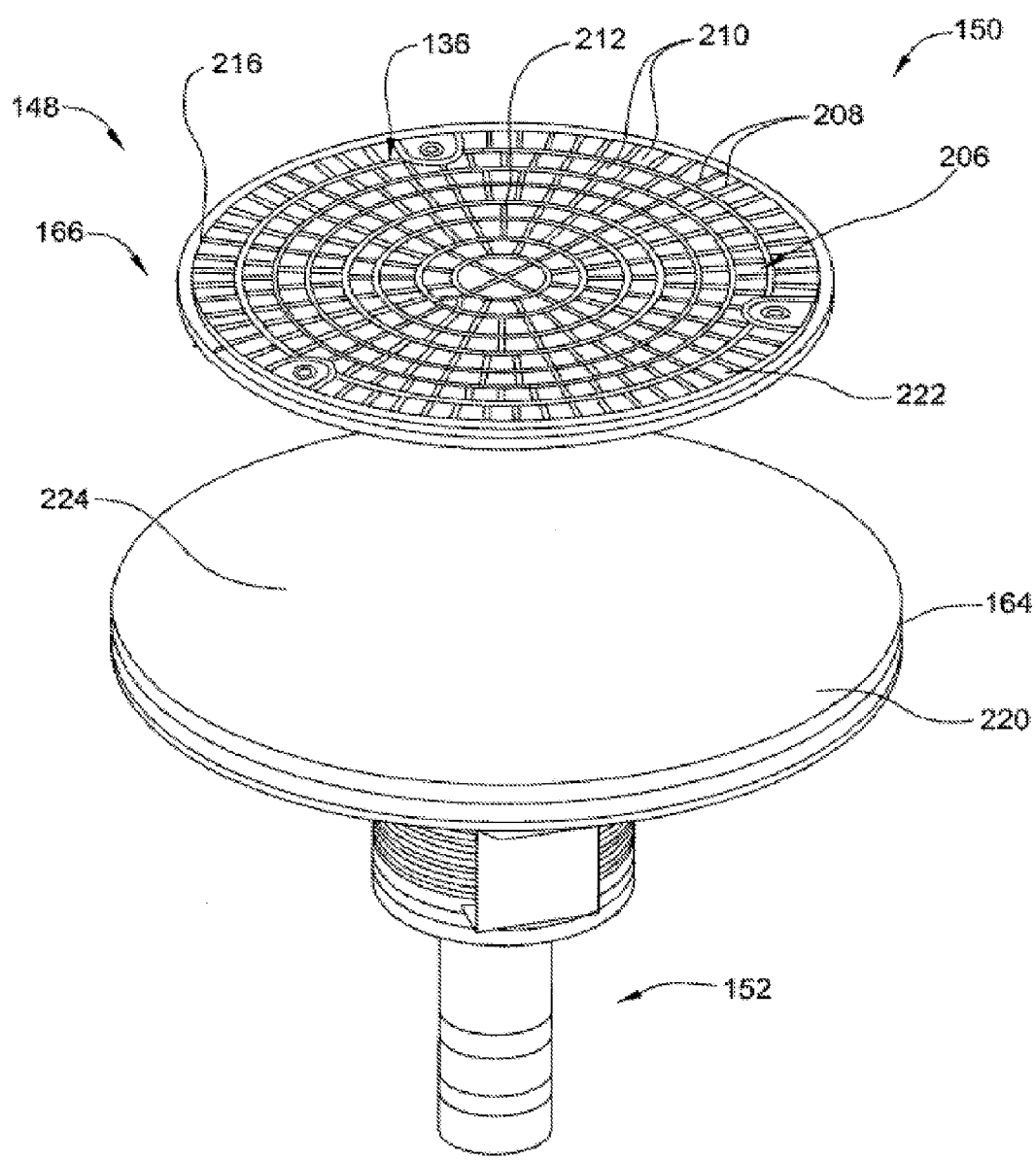
FIG. 2 depicts an exploded view of one embodiment of a substrate support assembly.

FIG. 2 depicts an exploded view of one embodiment of the substrate support assembly 148. The substrate support assembly 148 depicts an exploded view of the electrostatic chuck 150 and the pedestal 152. The electrostatic chuck 150 includes the electrostatic puck 166 or other ceramic body, as well as the thermally conductive base 164 attached to the electrostatic puck 166 or ceramic body. The electrostatic puck 166 or other ceramic body has a disc-like shape having an annular periphery 222 that may substantially match the shape and size of the substrate 144 positioned thereon. In one embodiment, the electrostatic puck 166 or other ceramic body may be fabricated by a ceramic material. Suitable examples of the ceramic materials include aluminum oxide ($Al_2O_3$), aluminum nitride (AlN), titanium oxide (TiO), titanium nitride (TiN), silicon carbide (SiC) and the like. In one embodiment, the ceramic body is a bulk sintered ceramic, which may be in the form of a wafer.

The thermally conductive base 164 attached below the electrostatic puck 166 or ceramic body may have a disc-like main portion 224 and an annular flange 220 extending outwardly from a main portion 224 and positioned on the pedestal 152. In one embodiment, the thermally conductive base 164 may be fabricated by a metal, such as aluminum or stainless steel or other suitable materials. Alternatively, the thermally conductive base 164 may be fabricated by a composite of ceramic, such as an aluminum-silicon alloy infiltrated SiC or Molybdenum to match a thermal expansion coefficient of the ceramic body. The thermally conductive base 164 should provide good strength and durability as well as heat transfer properties. An upper surface of the protective layer 136 may have an outer ring 216, multiple mesas 210 and channels 208, 212 between the mesas.

Figure 3:
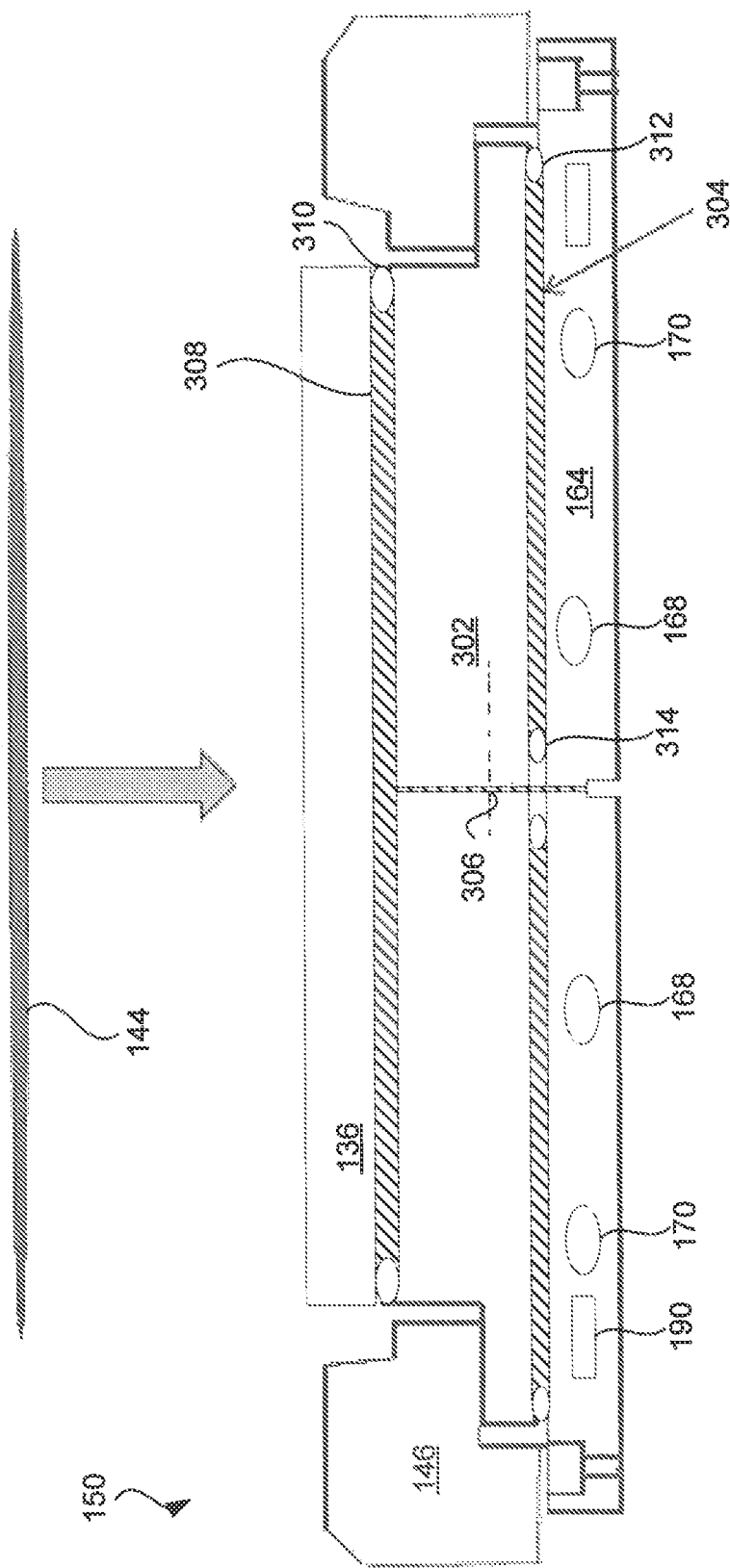
FIG. 3 depicts a side view of one embodiment of a substrate support assembly.

FIG. 3 illustrates a cross sectional side view of the electrostatic chuck 150. Referring to FIG. 3, the thermally conductive base 164 is coupled to a ceramic body 302 by a first metal bond 304. The ceramic body 302 may be a bulk sintered ceramic such as aluminum oxide ($Al_2O_3$), aluminum nitride (AlN), titanium oxide (TiO), titanium nitride (TiN), silicon carbide (SiC) and the like. The ceramic body 302 may be provided, for example, as a thin ceramic wafer. In one embodiment, the ceramic body has a thickness of about 1 mm. The ceramic body 302 may have an electrode connection 306 formed therein (e.g., by drilling a hole through the ceramic body and filling the hole with an electrically conductive material. The electrode connection 306 may connect a metal bond that functions as a clamping electrode to a chucking power source and/or to an RF source.

The first metal bond 304 facilitates thermal energy exchange between the ceramic body 302 and the thermally conductive base 164 and may reduce thermal expansion mismatch therebetween. The metal base 164 may include multiple conduits (e.g., an inner conduit 168 and an outer conduit 170) through which fluids may be flowed to heat or cool the electrostatic chuck 150 and a substrate 144. The metal base 164 may additionally include one or more embedded heaters 176, which may be resistive heating elements.

The first metal bond 304 mechanically bonds the thermally conductive base 164 to the ceramic body 302. In one embodiment, the metal bonding material 304 includes tin and/or indium. Alternatively, other metals may be used. Additionally, the first metal bond 304 may include a thin layer of aluminum and nickel (e.g., having a thickness of about 2-4 mil in one embodiment) between two layers of other metals (e.g., between two layers of tin). In one embodiment, the thin layer is initially a reactive multi-layer foil (referred to herein as a reactive foil) composed of alternating nanoscale layers of reactive materials such as aluminum and nickel. During a room temperature metal bonding process, the reactive foil may be activated (e.g., ignited), creating a near instantaneous reaction generating upwards of 1500 degrees C. This may cause upper and lower layers of metal, which act as a solder, to melt and reflow to bond the thermally conductive base 164 to the ceramic body 302. In one embodiment, the reactive foil is NanoFoil®, manufactured by Indium Corporation of America.

The electrostatic chuck 150 additionally includes a protective layer 136 that is coupled to the ceramic body 302 by a second metal bond 308. The protective layer 136 may be provided, for example, as a thin ceramic wafer. Mesas (not shown) may be formed on a surface of the protective layer, and the protective layer and ceramic body may include holes for the flow of helium and holes for lift pins. Such holes may be formed before or after the protective layer 136 is bonded to the ceramic body. The second metal bond 308 may be substantially similar to the first metal bond 304, and may have been generated using a room temperature bonding process (e.g., using an ignitable reactive foil). In one embodiment, the reactive foil has preformed foil features that correspond to surface features of the protective layer and/or the ceramic body. For example, the reactive foil may have preformed holes that correspond to helium holes and lift pin holes in the protective layer. Reactive foil having preformed foil features is described in greater detail below with reference to FIGS. 8A-11.

In one embodiment, both the first metal bond 304 and the second metal bond 308 are formed at the same time. For example, the entire structure may be pressed together in a fixture, and reactive foil between the thermally conductive base and ceramic body may be activated at approximately the same time as reactive foil between the protective layer and the ceramic body to form both metal bonds in parallel. Bond thickness may be approximately 25 microns to 500 microns (e.g., 150 to 250 microns in one embodiment).

The thickness of protective layer 136 may be selected to provide desired dielectric properties such as a specific breakdown voltage. In one embodiment, when the electrostatic chuck is to be used in a Coulombic mode, the protective layer has a thickness of between about 150-500 microns (and about 200-300 microns in one example embodiment). If the electrostatic chuck is to be used in a Johnson Raybek mode, the protective layer may have a thickness of around 1 mm.

As mentioned above, the protective layer 136 is a bulk sintered ceramic. In one embodiment, the protective layer is a ceramic composite as described above, which has a high hardness that resists wear (due to relative motion because of thermal property mismatch between substrate & the puck) during plasma processing. In one embodiment, the ceramic composite provides a Vickers hardness (5 Kgf) between about 5 GPa and about 11 GPa. In one embodiment, the ceramic composite provides a Vickers hardness of about 9-10 GPa. Additionally, the ceramic composite may have a density of around 4.90 g/cm3, a flexural strength of about 215 MPa, a fracture toughness of about 1.6 MPa·m$^{1/2}$, a Youngs Modulus of about 190 GPa, a thermal expansion of about 8.5×10$^{-6}$/K (20-900° C.), a thermal conductivity of about 3.5 W/mK, a dielectric constant of about 15.5 (measured at 20° C. 13.56 MHz), a dielectric loss tangent of about 11×10-4 (20° C. 13.56 MHz), and a volume resistivity of greater than 10$^{15}$ Ω·cm at room temperature in one embodiment.

In another embodiment, the protective layer is YAG. In another embodiment, the protective layer is sapphire. In still another embodiment, the protective layer is yttrium aluminum oxide ($Y_xAl_yO_z$).

A gasket 310 may be disposed at a periphery of the electrostatic chuck 150 between the protective layer 136 and the ceramic body 302. In one embodiment, the gasket 310 is a fluoro-polymer compressible o-ring. In another embodiment, the gasket is a liquid polymer that cures under pressure to form the gasket. The gasket 310 provides a protective seal that protects the metal bond 308 from exposure to plasma or corrosive gases. A similar gasket may encircle and protect the first metal bond 304. Note also that a similar type of gasket 314 may be used to seal off and separate the electrode connection 306 from the first metal bond 304.

A quartz ring 146, or other protective ring, surrounds and covers portions of the electrostatic chuck 150. The substrate 144 is lowered down over the electrostatic puck 166, and is held in place via electrostatic forces.

If the electrostatic chuck 150 is to be used for Coulombic chucking, then the thickness of the protective layer (dielectric above the electrode) may be about 200 microns to about 1 mm. If the electrostatic chuck 150 is to be used for Johnson Raybek chucking, then the thickness of the protective layer may be about 1 mm to about 1.5 mm.

Figure 4:
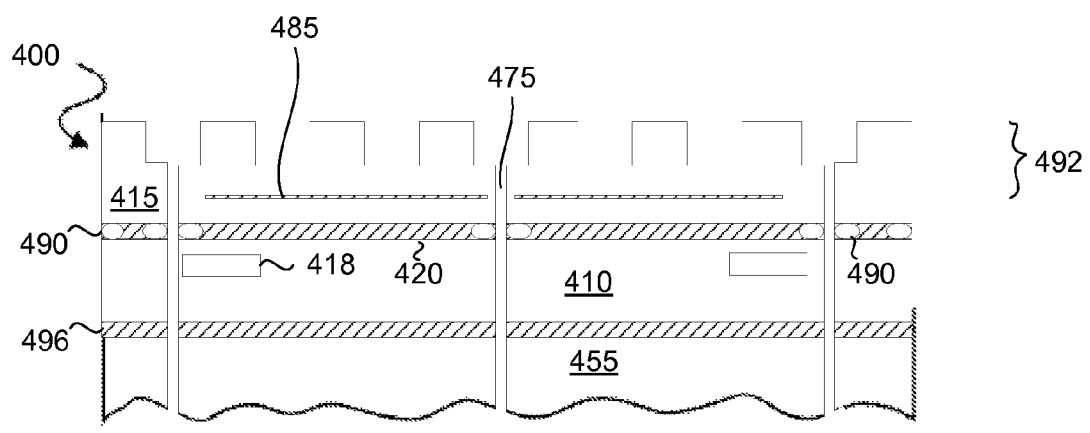
FIG. 4 depicts an exploded side view of one embodiment of a substrate support.

FIG. 4 illustrates a cross sectional side view of one embodiment of an electrostatic chuck 400. The electrostatic chuck 400 has a ceramic body 410 metal bonded to a protective layer 415 by a metal bond 420 and further bonded to a metal plate 455 by a silicone bond or other bond 496. In one embodiment, the ceramic body has a thickness of about 3 mm. The ceramic body 410 may include one or more heating elements 418. In one embodiment, the ceramic body 410 includes an electrode embedded therein. In another embodiment (as shown), an electrode 485 may be embedded in the protective layer 415. In yet another embodiment, a metal bond 420 may act as an electrode. In one embodiment, an upper portion 492 of the protective layer 415 that lies above the electrode 485 has a thickness of greater than 200 micron (e.g., 5 mil in one embodiment). The thickness of the upper portion 492 of the protective layer 415 may be selected to provide desired dielectric properties such as a specific breakdown voltage.

After the protective layer 415 is placed (and ground to a final thickness in some embodiments), mesas 418 are formed on an upper surface of the protective layer 415. The mesas 418 may be formed, for example, by bead blasting or salt blasting the surface of the protective layer 415. The mesas may be around 3-50 microns tall (about 10-15 in one embodiment) and about 200 microns in diameter in some embodiments.

Additionally, multiple holes 475 are drilled through the ceramic body 410 and/or protective layer 415. These holes 475 may be drilled before or after the protective layer 415 is bonded to the ceramic body 410, and holes in the protective layer 415 may line up with holes in the ceramic body 410 and/or base 455. In one embodiment, holes are drilled through the protective layer 415, ceramic body 410 and base 455 after the bonding is performed. Alternatively, holes may be drilled separately and then aligned prior to bonding. The holes may line up with preformed holes in a reactive foil used to form the metal bond 420 between the ceramic body 410 and protective layer 415. In one embodiment, gaskets 490 are placed or formed at a perimeter of the metal bond 420 and where the holes 475 meet the metal bond 420. The gaskets formed around the holes 475 may be omitted in some implementations in which the metal bond 420 is not used as an electrode. In one embodiment, the holes 475 have a diameter of about 4-7 mil. In one embodiment, the holes are formed by laser drilling. The holes 475 may deliver a thermally conductive gas such as helium to valleys or conduits between the mesas 418. The helium (or other thermally conductive gas) may facilitate heat transfer between a substrate and the electrostatic chuck 400. It is also possible to deposit the mesas 418 on top of substrate support (e.g., onto the protective layer 415). Ceramic plugs (not shown) may fill the holes. The ceramic plugs may be porous, and may permit the flow of helium. However, the ceramic plugs may prevent arcing of flowed plasma.

Figure 5:
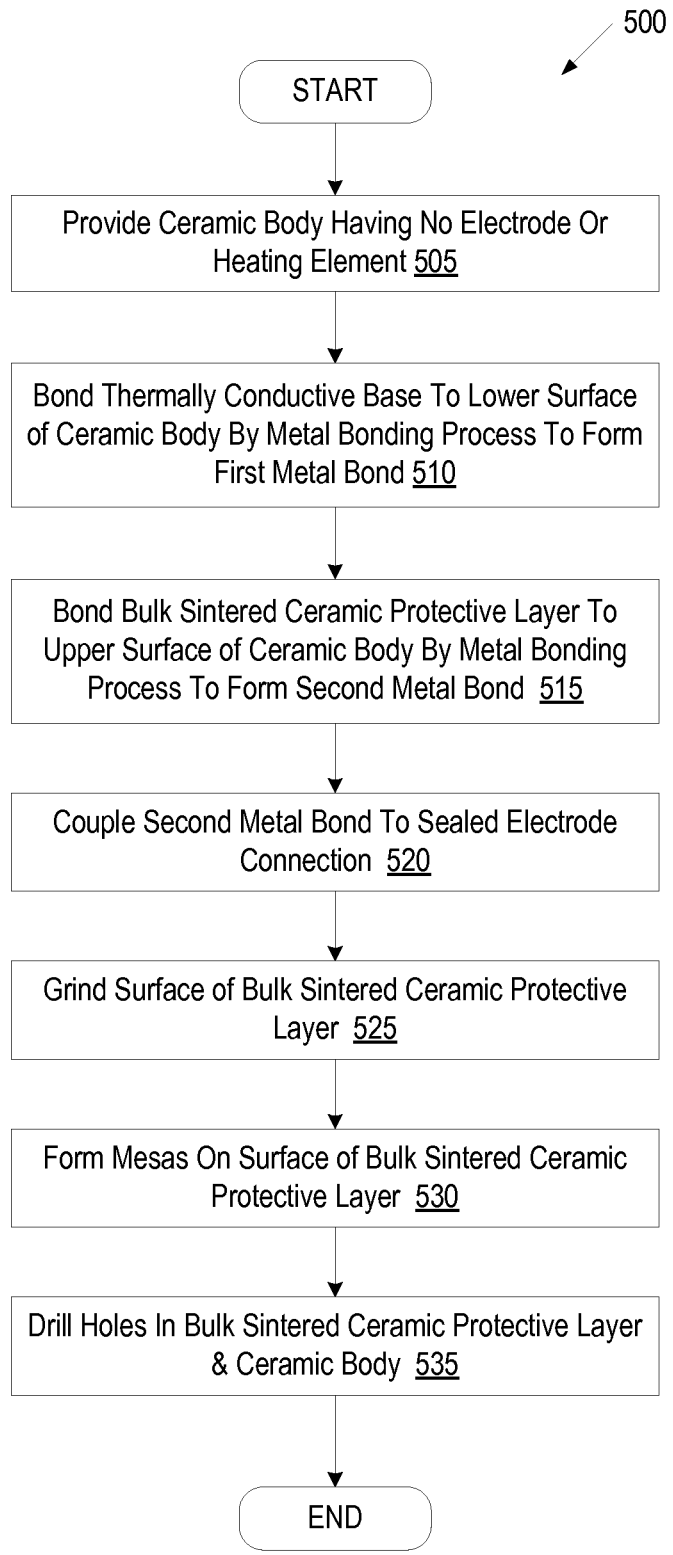
FIG. 5 illustrates one embodiment of a process for manufacturing an electrostatic chuck.

FIG. 5 illustrates one embodiment of a process 500 for manufacturing an electrostatic chuck. At block 505 of process 500, a ceramic body is provided. The provided ceramic body may be a ceramic wafer. The ceramic wafer may have undergone some processing, such as to form an electrode connector, but may lack heating elements, cooling channels, and an embedded electrode.

At block 510, a lower surface of the ceramic body is bonded to a thermally conductive base by performing a metal bonding process to form a first metal bond. At block 515, a bulk sintered ceramic protective layer is bonded to an upper surface of the ceramic body by the metal bonding process to form a second metal bond. The protective layer may be a ceramic wafer having a thickness of about 700 microns to about 1-2 mm. The metal bonding process is described with reference to FIG. 7. In one embodiment, the upper surface of the ceramic body is polished flat before bonding it to the protective layer. At block 520, the second metal bond is coupled to a sealed electrode connection. This coupling may occur as a result of the metal bonding process that forms the second metal bond.

At block 525, a surface of the protective layer is ground down to a desired thickness. The protective layer may be a dielectric material over a clamping electrode, and so the desired thickness may be a thickness that provides a specific breakdown voltage (e.g., about 200-300 microns in one embodiment).

At block 530, mesas are formed on an upper surface of the protective layer. At block 535, holes are formed in the protective layer and the ceramic body (e.g., by laser drilling) Note that the operations of block 530 may be performed after bonding the protective layer to the ceramic body (as shown), or may be performed prior to such bonding. Plugs may then be formed in the holes. In an alternative embodiment, the ceramic body may be bonded to the base after the mesas are formed, after the holes are formed and/or after the protective layer is bonded.

Figure 6:
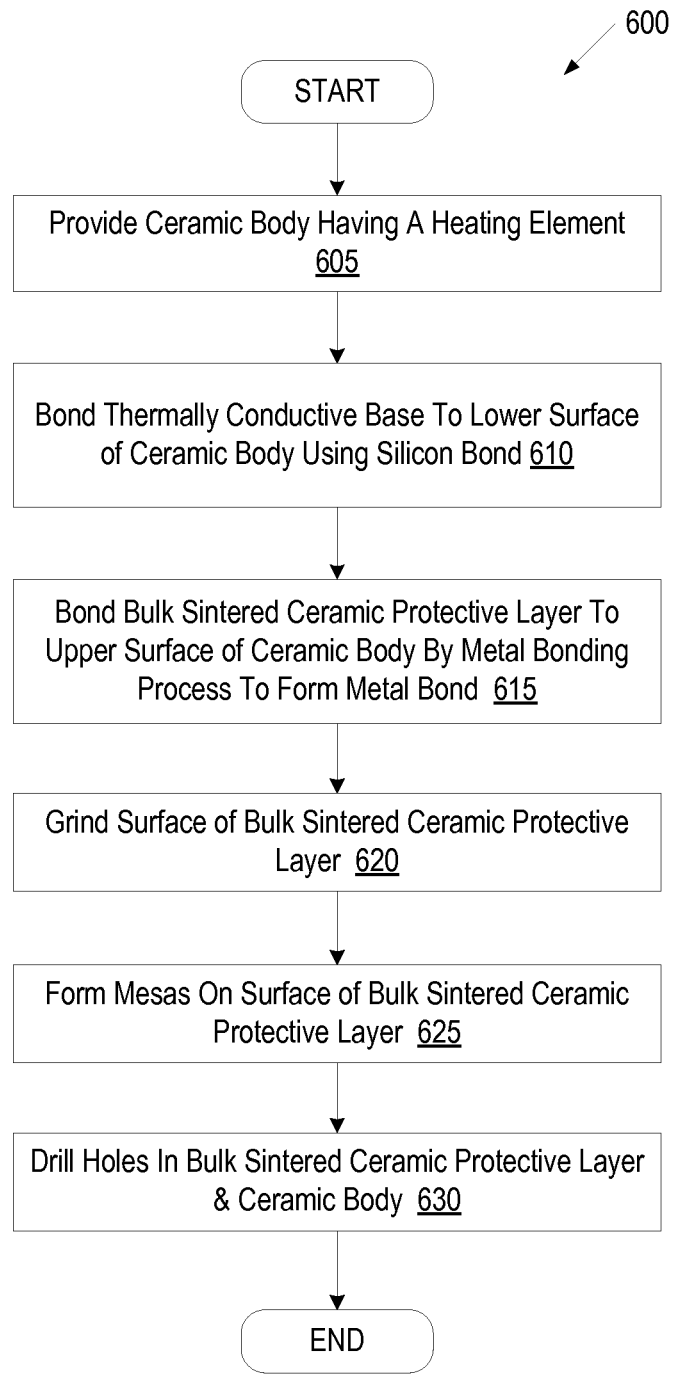
FIG. 6 illustrates another embodiment of a process for manufacturing an electrostatic chuck.

FIG. 6 illustrates another embodiment of a process for manufacturing an electrostatic chuck. At block 605 of process 600, a ceramic body is provided. The provided ceramic body may be a ceramic puck that includes one or more heating elements. The ceramic puck may or may not include an embedded electrode.

At block 610, a lower surface of the ceramic body is bonded to a thermally conductive base. The bond may be a silicone bond in one embodiment. In another embodiment, the bonding material may be a thermal conductive paste or tape having at least one of an acrylic based compound and silicone based compound. In yet another embodiment, the bonding material may be a thermal paste or tape having at least one of an acrylic based compound and silicone based compound, which may have metal or ceramic fillers mixed or added thereto. The metal filler may be at least one of Al, Mg, Ta, Ti, or combination thereof and the ceramic filler may be at least one of aluminum oxide ($Al_2O_3$), aluminum nitride (AlN), titanium diboride ($TiB_2$) or combination thereof.

At block 615, a bulk sintered ceramic protective layer is bonded to an upper surface of the ceramic body by a metal bonding process to form a metal bond. The metal bonding process is described with reference to FIG. 7.

At block 620, a surface of the protective layer is ground down to a desired thickness. The protective layer may be a dielectric material over a clamping electrode, and so the desired thickness may be a thickness that provides a specific breakdown voltage.

At block 625, mesas are formed on an upper surface of the protective layer. At block 630, holes are formed in the protective layer and the ceramic body (e.g., by laser drilling) In an alternative embodiment, the ceramic body may be bonded to the base after the mesas are formed, after the holes are formed or after the protective layer is bonded.

Figure 7:
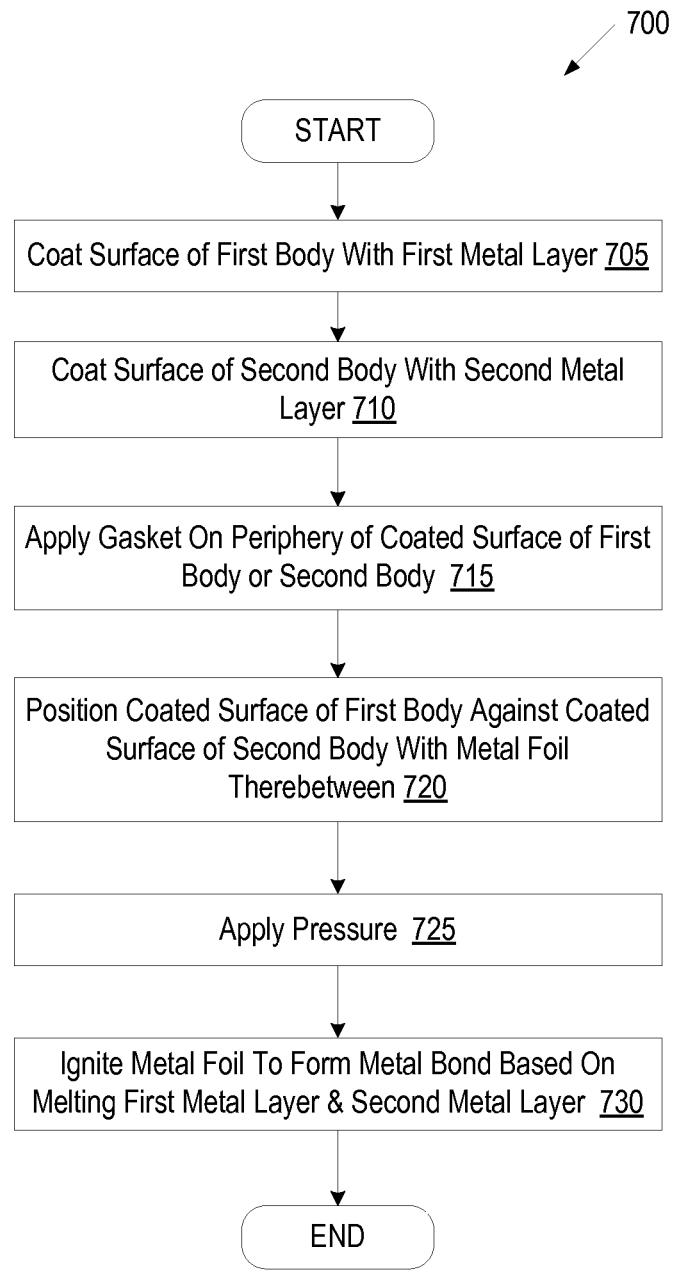
FIG. 7 illustrates one embodiment of a process for performing a metal bonding process.

FIG. 7 illustrates one embodiment for performing a metal bonding process. At block 705, a surface of a first body is coated with a first metal layer. The metal layer may be tin, indium or another metal. At block 710, a surface of a second body is coated with a second metal layer. The first body and second body may be, for example, a protective layer, a ceramic body or a thermally conductive base. For ceramic bodies (e.g, the ceramic body or protective layer), coating the surface with a metal layer may include first forming a titanium layer on the surface. Titanium has properties that cause it to form strong bonds with ceramics (such as by forming bonds with oxygen molecules in ceramics). A metal layer may then be formed over the titanium.

The metal layer may be tin or indium, for example. If tin is used for the metal layer, then processes of below 250 degrees C. may be performed using the electrostatic chuck since tin has a melting temperature of 250 degrees C. If indium is used for the metal layer, then processes of below 150 degrees C. may be performed using the electrostatic chuck since indium has a melting temperature of 150 degrees C. If higher temperature processes are to be performed, then a metal having a higher melting temperature should be used for the metal layers. The titanium layer and the subsequent metal layer may be formed by evaporation, electroplating, sputtering, or other metal deposition or growth techniques. Alternatively, the first metal layer may be a first sheet of solder (e.g., a sheet of tin or indium) that is positioned against the first body, and the second metal layer may be a second sheet of solder that is positioned against the second body. In one embodiment, the first metal layer and second metal layer are each approximately 1-20 mils thick (e.g., 25-100 microns in one embodiment).

At block 715, a gasket is applied on a periphery of the coated surface of the first body or second body. The gasket will protect the coated surface from interaction with corrosive gases or plasmas. In one embodiment, the gasket is a compressible o-ring. Alternatively, the gasket may be a liquid that cures under pressure to form the gasket.

At block 720, the coated surface of the first body is positioned against the coated surface of the second body with a reactive foil therebetween. In one embodiment, the reactive foil is approximately 50-150 microns thick. At block 725, pressure is applied to compress the first body against the second body. The pressure may be about 50 pounds per square inch (PSI) in one embodiment. While the pressure is applied, at block 730 the reactive foil is activated. The reactive foil may be activated by providing a small burst of local energy, such as by using optical, electrical or thermal energy sources. Ignition of the reactive foil causes a chemical reaction that produces a sudden and momentary localized burst of heat up to about 1500 degrees C., which melts the first and second metal layers, causing them to reflow into a single metal bond. This nano-bonding technique for forming a metal bond precisely delivers localized heat that does not penetrate the bodies being bonded. Since the bodies are not heated, the bodies may have a significant mismatch in coefficients of thermal expansion (CTE) without a detrimental effect (e.g., without inducing stress or warping).

Figure 8:
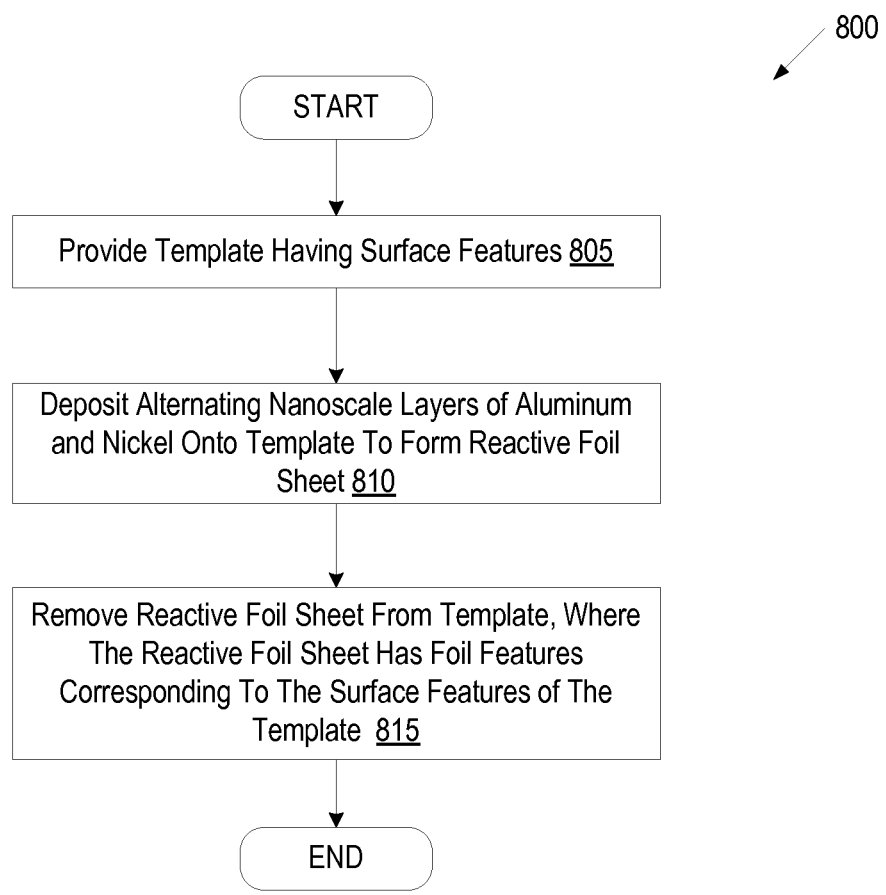
FIG. 8 illustrates one embodiment of a process for manufacturing reactive foil having preformed foil features.
Figure 9:
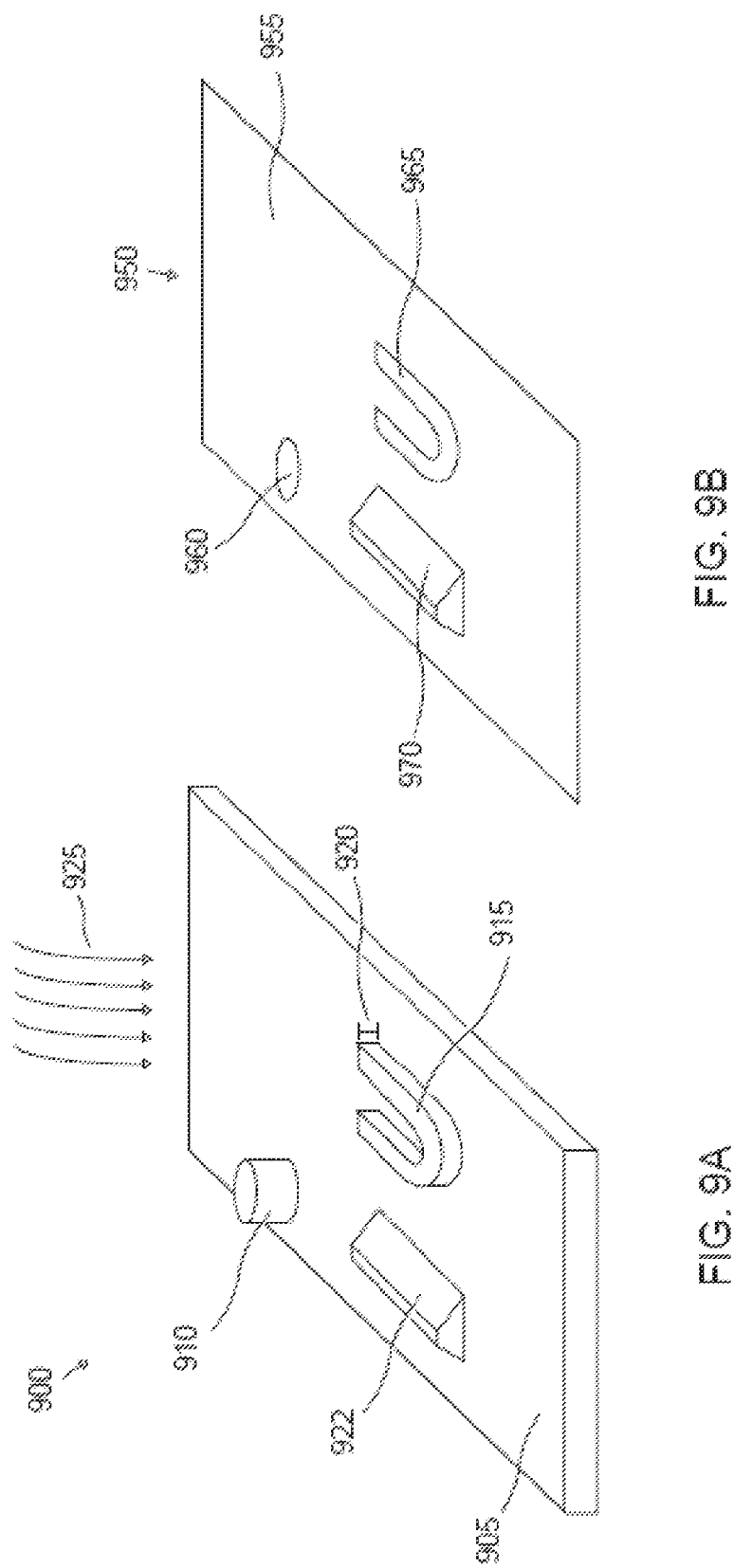
FIG. 9A illustrates deposition of nanoscale metal layers onto a template having surface features.
FIG. 9B illustrates a reactive foil sheet having preformed foil features.
Figure 10:
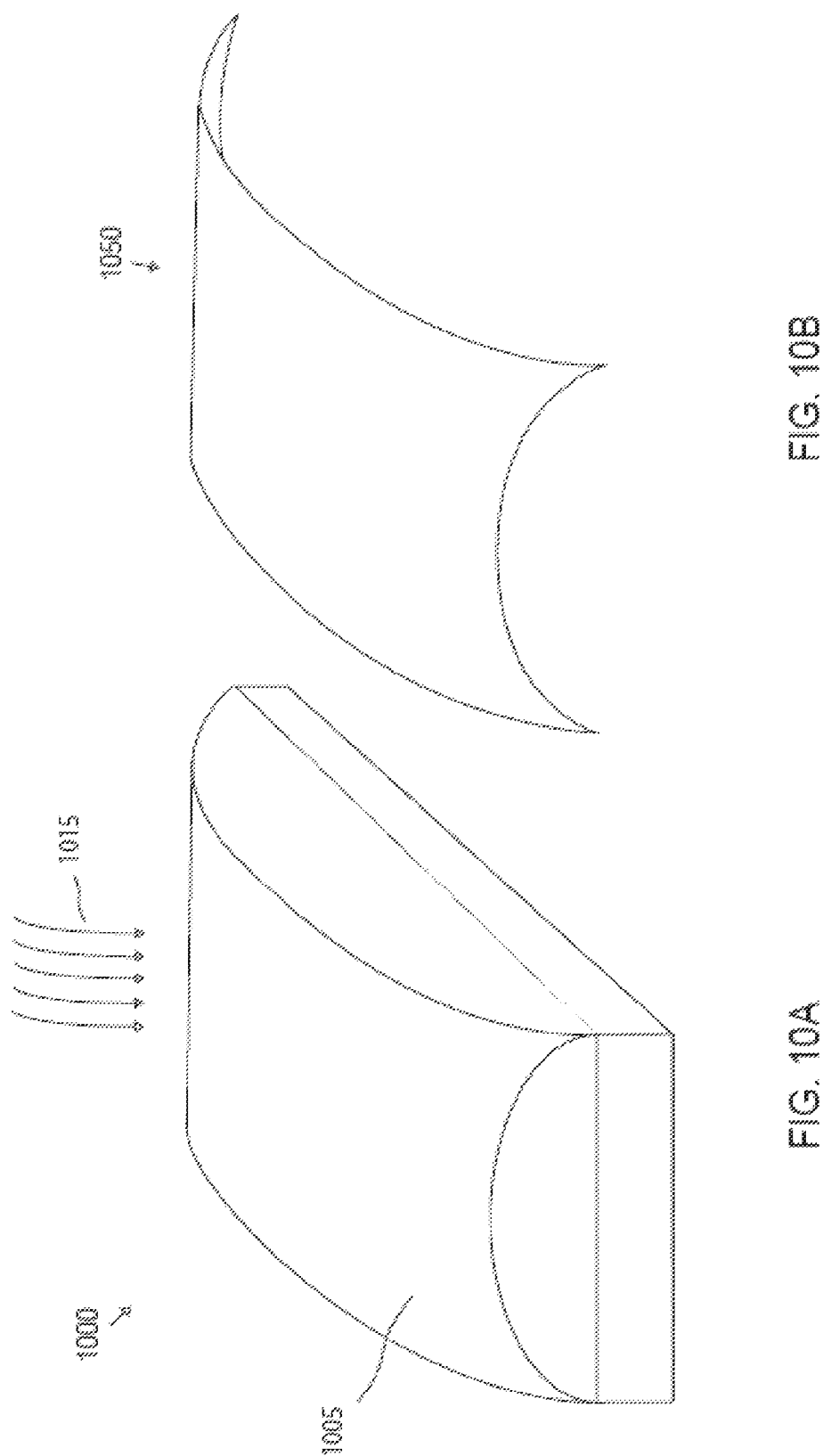
FIG. 10A illustrates deposition of nanoscale metal layers onto a non-planar template.
FIG. 10B illustrates a non-planar reactive foil sheet.

FIG. 8 illustrates one embodiment of a process 800 for manufacturing a reactive foil sheet having preformed foil features. At block 805 of process 800, a template having surface features is provided. The template may be any rigid material in one embodiment. The template may have a substantially planar surface, with one or more surface features. Alternatively, the template may have a non-planar surface with or without surface features.

The surface features may include positive steps (e.g., standoffs) and/or negative steps (e.g., holes or trenches) in a surface of the template. The steps may have a height or depth that is sufficient to cause a first portion of a deposited reactive foil sheet that covers the step to be discontiguous with a second portion of the reactive foil sheet that covers a remainder of the template. For example, standoffs may have a height of about 1-25 mm, and holes/trenches may have a depth of about 1-25 mm. In one particular embodiment, the steps have a height or depth of about 2-10 mm. Instead, deposited reactive foil may have the shape of the non-planar regions.

The surface features may also include non-planar regions such as bumps, dips, curves, and so forth. These surface features may not cause any portions of a deposited reactive foil sheet to be discontiguous with other portions of the reactive foil sheet.

At block 810, alternating nanoscale layers of at least two reactive materials are deposited onto the template to form a reactive foil sheet. In one embodiment, the reactive materials are metals that are sputtered onto the template. The reactive materials may also be formed by evaporation, electroplating, or other metal deposition or growth techniques. Thousands of alternating layers of the two reactive materials may be deposited onto the template. Each layer may have a thickness on the scale of one nanometer to tens of nanometers. In one embodiment, the reactive foil is approximately 10-500 microns thick, depending on the number of nanoscale layers that the reactive foil includes. In a further embodiment, the reactive foil is about 50-150 microns thick.

In one embodiment, the two reactive materials are aluminum (Al) and nickel (Ni), and the reactive foil is a stack of Al/Ni layers. Alternatively, the two reactive materials may be aluminum and titanium (Ti) (producing a stack of Al/Ti layers), titanium and boron (B) (producing a stack of Ti/B layers), copper (Cu) and nickel (producing a stack of Cu/Ni layers) or titanium and amorphous silicon (Si) (producing a stack of Ti/Si layers). Other reactive materials may also be used to form the reactive foil.

For some surface features, a height or depth of the surface feature may cause a portion of a deposited reactive foil sheet to be discontiguous with other portions of the reactive foil sheet. In many cases, this discontinuity is intended. However, if no discontinuity is desired, then an angle of the template with regards to a deposition source may be controlled to eliminate any such discontinuity. In one embodiment, the template is rotated and/or the angle of the template with relation to the deposition source is changed during the deposition process. In another embodiment, multiple deposition sources having different locations are used. The arrangement of the deposition sources may be set to maximize coverage of a non-planar surface and/or surface features while minimizing thickness variations in the alternating layers.

At block 815, the reactive foil sheet is removed from the template. The reactive foil sheet may have a weak mechanical bond to the template, enabling the reactive foil to be removed from the template without tearing. The reactive foil sheet may have foil features that correspond to surface features of the template. For example, the reactive foil sheet may have voids corresponding to the regions of the template that had steps. Additionally, the reactive foil sheet may have non-planar (e.g., three dimensional) features corresponding to three dimensional features in the template. The features may have various sizes and shapes. The preformed foil features may correspond to surface features of one or more substrates that the reactive foil is designed to bond. Accordingly, the formed reactive foil may be production worthy. For example, the reactive foil may be set in place on a substrate having surface features and energized to create a metal bond without first machining the reactive foil to accommodate the surface features.

FIG. 9A illustrates deposition of nanoscale metal layers onto a template 900 having surface features. The template 900 has a substantially planar surface 905 with three surface features 910, 915, 922. Surface features 910 and 915 are steps having a height 920. The height 920 is sufficiently tall to cause nanoscale metal layers deposited 925 onto the features 910, 915 to be discontiguous with nanoscale metal layers deposited 925 onto a remainder of the template's surface 905. Surface feature 922 is a non-planar (e.g., three dimensional) feature. Metal layers 925 deposited onto feature 922 are contiguous with metal layers deposited onto the remainder of the template's surface 905.

FIG. 9B illustrates a reactive foil sheet 950 having preformed foil features 960, 965, 970. The reactive foil sheet 950 is formed by depositing alternating nanoscale metal layers onto template 900 of FIG. 9A. The reactive foil sheet 950 is substantially planar. However, reactive foil sheet 950 includes a non-planar feature 970 caused by deposition over surface feature 922 of template 900. Foil features 960 and 965 are voids in reactive foil sheet 950, and correspond to surface features 910, 920 of template 900.

FIG. 10A illustrates deposition of nanoscale metal layers onto a template 1000 having a non-planar surface 1005. The template 1000 may have a three dimensional shape as shown, or may have any other three dimensional shape. FIG. 10B illustrates a non-planar reactive foil sheet 1050 having a three dimensional shape that matches the three dimensional shape of template 1000. This three dimensional shape may correspond to a three dimensional shape of two substrates that the reactive foil will be used to bond together. Accordingly, the reactive foil sheet 1050 may be place onto one of the substrates in an orientation and position that causes a shape and any features of the reactive foil sheet 1050 to line up with a shape and features of the substrate. The second substrate may then be placed over the reactive foil sheet, and the reactive foil sheet may be ignited. Because the reactive foil sheet has a shape that matches the substrates that it will bond, the reactive foil sheet will not be deformed or torn. This may minimize or eliminate leakage paths that might otherwise be caused by attempting to use a planar reactive foil sheet to bond non-planar surfaces.

The reactive foil sheets with preformed features described herein may be used to bond any two substrates. The reactive foil sheets may be particularly useful for applications in which a room temperature, rapid bond is to be formed without vacuum and between substrates having surface features. For example, the reactive foil may be used to bond an electrostatic puck with helium holes to a cooling base plate. The reactive foil sheets described herein may also be used to bond a protective layer over a showerhead, which may have thousands of gas distribution holes as well as divets and/or standoffs around the gas distribution holes. The reactive foil sheets may also be used to bond semiconductor devices, solar devices, and other devices.

Figure 11:
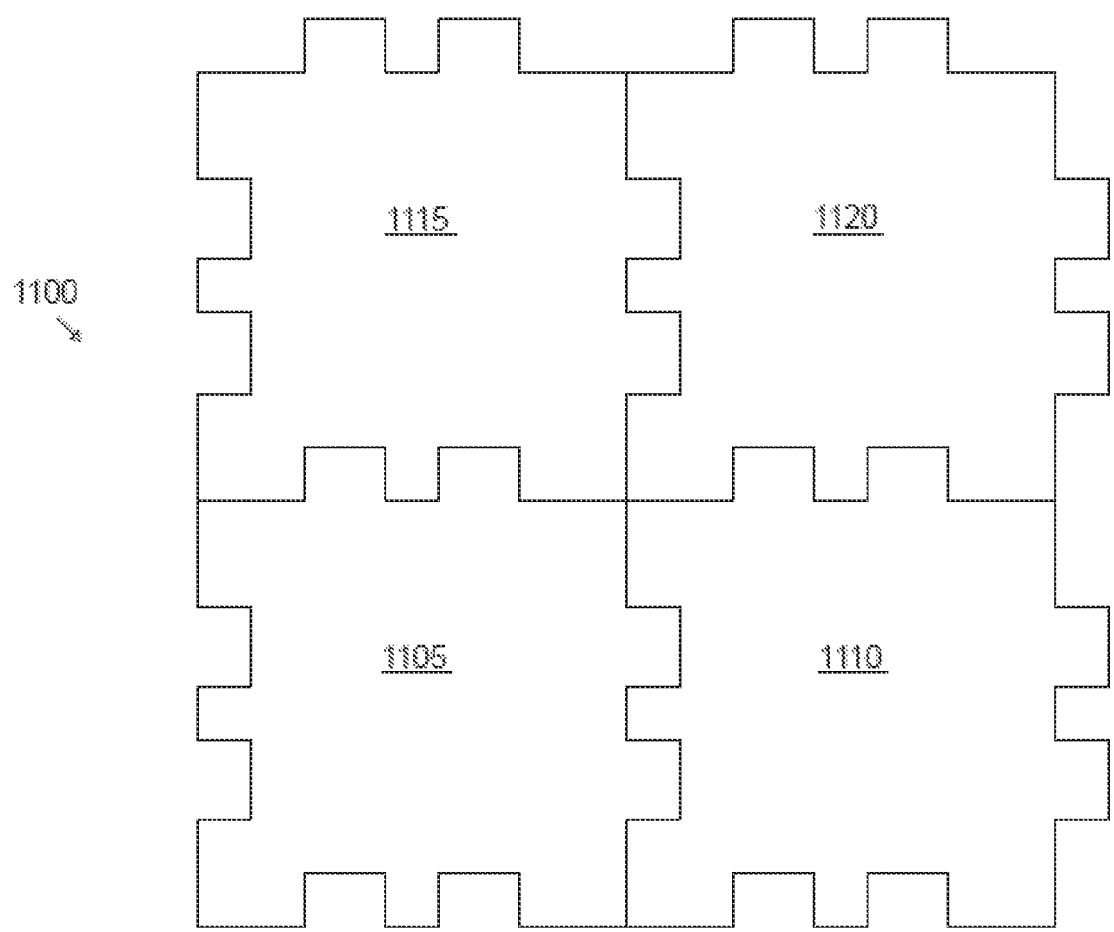
FIG. 11 illustrates interlocking reactive foil sheets.

FIG. 11 illustrates a continuous reactive foil 1100 formed of interlocking reactive foil sheets 1105, 1110, 1115, 1120. The perimeters of the reactive foil sheets 1105-1120 may have a tessellating puzzle shape that enables the reactive foil sheets 1105-1120 to interlock. The tessellating puzzle shape may be formed by depositing alternating nanoscale metal layers over a template having a step around a perimeter of the template with the tessellating puzzle shape. Accordingly, the above described process 800 may be used to create interlocking reactive foil sheets. These interlocking reactive foil sheets enable any sized substrate to be bonded using a metal bonding process without introducing leakage pathways.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An electrostatic chuck comprising:
a ceramic body having a first ceramic material composition;
a thermally conductive base bonded to a lower surface of the ceramic body; and
a plasma resistant protective layer bonded to an upper surface of the ceramic body by a metal bond that is substantially in direct physical contact with the ceramic body and the plasma resistant protective layer, the plasma resistant protective layer comprising a bulk sintered ceramic article having a second ceramic material composition that is different from the first ceramic material composition, wherein the metal bond functions as an electrode of the electrostatic chuck, and wherein the metal bond comprises:
a first metal layer;
a second metal layer; and
a third metal layer between the first metal layer and the second metal layer, the third metal layer comprising a combination of at least two different metals; and
an electrode connection, formed in the ceramic body, that is to electrically connect the metal bond to at least one of a power source or a radio frequency source, the electrode connection comprising a hole filled with an electrically conductive material.

2. The electrostatic chuck of claim 1, wherein the plasma resistant protective layer is a ceramic compound comprising $Y_4Al_2O_9$ and a solid-solution of $Y_2O_3$—$ZrO_2$.

3. The electrostatic chuck of claim 1, wherein the ceramic body does not include any electrode.

4. The electrostatic chuck of claim 1, wherein the thermally conductive base is bonded to the lower surface of the ceramic body by an additional metal bond, and wherein the thermally conductive base comprises one or more heating elements.

5. The electrostatic chuck of claim 1, wherein a thickness of the metal bond is approximately 5-20 mil and a thickness of the plasma resistant protective layer is approximately 200-900 microns.

6. The electrostatic chuck of claim 1, wherein:
the first metal layer comprises at least one of tin or indium;
the second metal layer comprises at least one of tin or indium; and
the combination of the two different metals in the third metal layer comprises at least one of a combination of aluminum and nickel or a combination of copper and nickel.

7. The electrostatic chuck of claim 1, wherein the thermally conductive base is bonded to the lower surface of the ceramic body by a silicone bond, and wherein the ceramic body comprises one or more heating elements.

8. The electrostatic chuck of claim 1, further comprising:
at least one of a gasket or an o-ring between the upper surface of the ceramic body and the protective layer, at least one of the gasket or the o-ring being at an outer perimeter of the upper surface to protect the metal bond.

9. The electrostatic chuck of claim 1, wherein the plasma resistant protective layer comprises $Y_xAl_yO_z$.

10. The electrostatic chuck in claim 1, wherein the electrostatic chuck is capable of temperature changes at a rate of change of +/−2° C./s.

11. A substrate support assembly having a ceramic body, a thermally conductive base bonded to a lower surface of the ceramic body, and a plasma resistant protective layer bonded to an upper surface of the ceramic body by a metal bond that is substantially in direct physical contact with the ceramic body and the plasma resistant protective layer, the substrate support assembly having been manufactured by a manufacturing process comprising:

bonding the lower surface of the ceramic body to the thermally conductive base, wherein the ceramic body has a first ceramic material composition; and bonding the upper surface of the ceramic body to the plasma resistant protective layer by a metal bonding process, wherein the plasma resistant protective layer has a second ceramic material composition that is different from the first ceramic material composition, and wherein bonding the upper surface of the ceramic body to the plasma resistant protective layer comprises:

coating the upper surface of the ceramic body with a first metal layer;

coating a surface of the plasma resistant protective layer with a second metal layer;

positioning the coated surface of the plasma resistant protective layer against the coated upper surface of the ceramic body with a reactive foil there between, the reactive foil comprising at least two different metals; and igniting the reactive foil to form a metal bond based on melting the first metal layer and the second metal layer, wherein the metal bond functions as an electrode of the substrate support assembly, and wherein the metal bond comprises the first metal layer, the second metal layer and a third metal layer between the first metal layer and the second metal layer, the third metal layer comprising a combination of the at least two different metals; and forming an electrode connection that is to electrically connect the metal bond to at least one of a power source or a radio frequency source, the electrode connection comprising a hole filled with an electrically conductive material.

12. The substrate support assembly of claim 11, the manufacturing process further comprising:

positioning a gasket on an outer perimeter of the coated upper surface of the ceramic body prior to positioning the plasma resistant protective layer on the ceramic body; and compressing the gasket.

13. The substrate support assembly of claim 11, the manufacturing process further comprising:

grinding the plasma resistant protective layer from an initial thickness to a final thickness of approximately 150-400 microns after performing the bonding;

forming mesas on an upper surface of the plasma resistant protective layer; and drilling holes in at least one of the plasma resistant protective layer or the ceramic body.

* * * * *